US012382707B1

(12) United States Patent
Sun et al.

(10) Patent No.: US 12,382,707 B1
(45) Date of Patent: Aug. 5, 2025

(54) CONDUCTIVE CHANNEL STRUCTURE FOR SiC DEVICES, FULLY INTEGRATED SiC DEVICE AND FULLY INTEGRATED MANUFACTURING PROCESS THEREOF

(71) Applicant: SOUTHEAST UNIVERSITY, Nanjing (CN)

(72) Inventors: Weifeng Sun, Nanjing (CN); Long Zhang, Nanjing (CN); Siyang Liu, Nanjing (CN); Yong Gu, Nanjing (CN); Xiangyu Hou, Nanjing (CN); Jie Ma, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 19/033,509

(22) Filed: Jan. 22, 2025

Related U.S. Application Data

(63) Continuation of application No. PCT/CN2024/102864, filed on Jul. 1, 2024.

(30) Foreign Application Priority Data

Feb. 1, 2024 (CN) .......................... 202410147596.1

(51) Int. Cl.
*H10D 84/03* (2025.01)
*H10D 30/01* (2025.01)
(Continued)

(52) U.S. Cl.
CPC ....... *H10D 84/035* (2025.01); *H10D 30/0281* (2025.01); *H10D 30/65* (2025.01);
(Continued)

(58) Field of Classification Search
CPC ............... H10D 30/0281; H10D 30/65; H10D 62/8325; H10D 84/0128; H10D 84/035; H10D 84/832
(Continued)

(56) References Cited

U.S. PATENT DOCUMENTS

| | | | |
|---|---|---|---|
| 2010/0155836 A1* | 6/2010 | Hebert | .................... H01L 23/62 257/334 |
| 2011/0042745 A1 | 2/2011 | Negoro | |

(Continued)

FOREIGN PATENT DOCUMENTS

| | | |
|---|---|---|
| CN | 109830538 A | 5/2019 |
| CN | 114695564 A | 7/2022 |

(Continued)

*Primary Examiner* — Fazli Erdem
(74) *Attorney, Agent, or Firm* — Bayramoglu Law Offices LLC

(57) ABSTRACT

A conductive channel structure for SiC devices, a fully integrated SiC device and a fully integrated manufacturing process thereof are provided. The fully integrated SiC device features a low-voltage region, a first high-voltage region and a second high-voltage region separated by isolation structures on the same SiC-based chip, and integrates first and second conductivity type MOS devices. The first and second conductivity type devices employ first and second conductivity type conductive channels respectively with alternating N-type and P-type first or second conductivity type areas above them. The manufacturing process includes sequentially stacking a second conductivity type epitaxial layer and buffer layer on an N-type substrate; and within the second conductivity type buffer layer, arranging first conductivity type well regions, heavily doped regions, channel regions, second conductivity type well regions, isolation structures, heavily doped regions, and channel regions.

4 Claims, 9 Drawing Sheets

(51) Int. Cl.
  *H10D 30/65* (2025.01)
  *H10D 62/832* (2025.01)
  *H10D 84/01* (2025.01)
  *H10D 84/83* (2025.01)
(52) U.S. Cl.
  CPC ..... *H10D 62/8325* (2025.01); *H10D 84/0128* (2025.01); *H10D 84/832* (2025.01)
(58) Field of Classification Search
  USPC .......................................................... 257/343
  See application file for complete search history.

(56) References Cited

U.S. PATENT DOCUMENTS

| | | | | |
|---|---|---|---|---|
| 2018/0301379 | A1* | 10/2018 | Clark | H10D 10/60 |
| 2019/0362972 | A1* | 11/2019 | Schulze | H01L 21/02378 |
| 2022/0115373 | A1* | 4/2022 | Goldsman | H10D 84/035 |
| 2022/0115502 | A1* | 4/2022 | Goldsman | H10D 62/393 |

FOREIGN PATENT DOCUMENTS

| | | | |
|---|---|---|---|
| CN | 115910931 A | * | 4/2023 |
| CN | 117995906 A | | 5/2024 |

* cited by examiner

CONDUCTIVE CHANNEL STRUCTURE FOR SiC DEVICES, FULLY INTEGRATED SiC DEVICE AND FULLY INTEGRATED MANUFACTURING PROCESS THEREOF

CROSS-REFERENCE TO THE RELATED APPLICATIONS

This application is a continuation application of International Application No. PCT/CN2024/102864, filed on Jul. 1, 2024, which is based upon and claims priority to Chinese Patent Application No. 202410147596.1, filed on Feb. 1, 2024, the entire contents of which are incorporated herein by reference.

TECHNICAL FIELD

The invention relates to the technical field of semiconductor power devices, in particular to a conductive channel structure for silicon carbide (SiC) devices, a fully integrated SiC device and a fully integrated manufacturing process thereof.

BACKGROUND

With the continuous advancement of microelectronic technology, traditional silicon-based devices are nearing their material limits. In contrast, SiC materials are widely considered the most competitive alternative to silicon-based devices due to their wide bandgap, high critical electric field strength, high saturation velocity, and high thermal conductivity, especially in special fields such as new energy vehicles, energy exploration drilling, and nuclear power. However, SiC devices currently face two main issues. First, due to severe lattice mismatch between SiC and $SiO_2$, the interface state density of SiC devices is significantly higher than that of silicon-based devices. This makes the channel carrier mobility of SiC devices far lower than that of silicon-based devices, increasing the proportion of channel resistance in the overall on-resistance. To address this issue, a SiC buried channel structure can be employed. The buried channel structure involves adding a layer in a channel region of the SiC device with the same doping type as the source and drain regions. This design allows the buried channel to be depleted through interface states and the PN junction when the device is off and facilitates current flow in the buried channel when it is on, thereby mitigating the impact of interface states. However, the interface state density in SiC is related to the manufacturing process, making it difficult to predict accurately. This complicates the control of doping concentration and injection depth in the channel, ultimately hindering the effective application of the buried channel structure. Second, the issue of excessive channel resistance in SiC due to high interface state density is particularly pronounced in low-voltage devices. As a result, current SiC applications are primarily in discrete devices, while the accompanying circuit components still utilize silicon chips. However, traditional silicon chips have poor high-temperature and radiation resistance, which hinders the effective use of SiC power devices. Therefore, if new channel structures can be developed to improve channel carrier mobility and reduce channel resistance, it would solve the issues faced by low-voltage SiC devices. This could enable the monolithic integration of SiC power devices and their circuits, improving the overall performance and reliability of power electronic systems, especially in high-temperature and radiation-resistant applications.

SUMMARY

To address the above issues, the invention proposes a conductive channel structure for SiC devices that improves the breakdown voltage of SiC devices, reduces the impact of interface states on channel carrier mobility, and enhances the channel carrier mobility of SiC devices to lower channel resistance, a fully integrated SiC device and a fully integrated manufacturing process thereof. The invention resolves the problems encountered by traditional silicon-based chips used as SiC drive circuits, including high parasitic effects, poor high-temperature characteristics, and weak radiation resistance.

The technical solutions of the present invention are as follows.

The invention provides a conductive channel structure for SiC devices, which is a first conductivity type conductive channel structure and comprises a first conductivity type lower channel region arranged in the middle of a second conductivity type buffer layer of the SiC device, wherein a first conductivity type area is arranged on the first conductivity type lower channel region, and a top of the first conductivity type area is positioned on an upper surface of the second conductivity type buffer layer.

The invention provides another conductive channel structure for SiC devices, which is a second conductivity type conductive channel structure and comprises a second conductivity type lower channel region arranged in the middle of a second conductivity type buffer layer of the SiC device, wherein a second conductivity type area is arranged on the second conductivity type lower channel region, and a top of the second conductivity type area is positioned on an upper surface of the second conductivity type buffer layer.

The invention further provides a fully integrated SiC device, comprising: a first conductivity type SiC substrate layer, wherein a second conductivity type epitaxial layer is arranged on the first conductivity type SiC substrate layer, a second conductivity type buffer layer is arranged on the second conductivity type epitaxial layer, and a field effect oxide layer covers the second conductivity type buffer layer; a second conductivity type isolation structure is arranged in the second conductivity type buffer layer, and the second conductivity type buffer layer is divided into a low-voltage region, a first high-voltage region and a second high-voltage region by the second conductivity type isolation structure; a first conductivity type SiC lateral double-diffused metal oxide semiconductor (LDMOS) device is arranged in the first high-voltage region, and a first conductivity type SiC MOS device and/or a second conductivity type SiC MOS device are respectively arranged in the low-voltage region and the second high-voltage region; at least one of the first conductivity type SiC LDMOS device and the first conductivity type SiC MOS device has a conductive channel structure which is the first conductivity type conductive channel structure as claimed in claim, and/or the second conductivity type SiC MOS device has a conductive channel structure which is the second conductivity type conductive channel structure as claimed in claim 2;

the SiC LDMOS device comprises a first conductivity type well region arranged in the second conductivity type buffer layer located in the first high-voltage region and a first conductivity type drain region of the SiC LDMOS device arranged in the first conductivity type well region; a first conductivity type well region is also arranged in the second conductivity type buffer layer of the second high-voltage region, with a first conductivity type heavily doped region arranged therein; and a drain metal electrode is connected to the first conductivity type drain region and the first conductivity type heavily doped region of the SiC LDMOS device.

Further, the invention provides a fully integrated manufacturing process for a fully integrated SiC device, comprising the following steps:

forming a first conductivity type substrate on a SiC base, growing a second conductivity type epitaxial layer on the first conductivity type substrate, and growing a second conductivity type buffer layer on the second conductivity type epitaxial layer;

using ion implantation to form two second conductivity type isolation structures in the second conductivity type buffer layer, which reach deep into the second conductivity type epitaxial layer, and divide the second conductivity type buffer layer into a low-voltage region, a first high-voltage region and a second high-voltage region;

performing ion implantation on the second conductivity type buffer layer and forming first conductivity type well regions in the low-voltage region, the first high-voltage region and the second high-voltage region respectively; performing ion implantation on the second conductivity type buffer layer of the first high-voltage region and the first conductivity type well region of the second high-voltage region to form a second conductivity type well region;

using ion implantation to form two first conductivity type heavily doped regions serving as a source region and drain region of a first conductivity type SiC MOS device, and one first conductivity type heavily doped region of a second conductivity type MOS device in the second conductivity type buffer layer and the first conductivity type well region of the low-voltage region, one first conductivity type heavily doped region serving as a drain region of a SiC LDMOS device, and one first conductivity type heavily doped region serving as a source region of the SiC LDMOS device in the first conductivity type well region and the second conductivity type well region of the first high-voltage region, and two first conductivity type heavily doped regions serving as the source region and drain region of the first conductivity type SiC MOS device, a first conductivity type heavily doped region of the second conductivity type MOS device, and a first conductivity type heavily doped region serving as a heavily doped ohmic contact region in the second conductivity type well region and the first conductivity type well region of the second high-voltage region;

using ion implantation to form one second conductivity type heavily doped region of a first conductivity type MOS device and two second conductivity type heavily doped regions serving as a source region and drain region of a second conductivity type SiC MOS device in the second conductivity type buffer layer and the first conductivity type well region of the low-voltage region, one second conductivity type heavily doped region of the SiC LDMOS device in the second conductivity type well region of the first high-voltage region, and two second conductivity type heavily doped regions serving as the source region and drain region of the second conductivity type SiC MOS device, and a second conductivity type heavily doped region of the first conductivity type MOS device in the first conductivity type well region and the second conductivity type well region of the second high-voltage region;

preparing conductive channel structures, comprising the preparation of a first conductivity type conductive channel structure and a second conductivity type conductive channel structure; the first conductivity type conductive channel structure being prepared between the source region and the drain region of the first conductivity type MOS device, as well as between the source region of the SiC LDMOS device and the first conductivity type well region of the first high-voltage region; specifically, first, performing ion implantation in the second conductivity type buffer layer at a depth of 0.1-0.3 μm to form a first conductivity type lower channel region, two ends of the first conductivity type lower channel region in the first conductivity type MOS device being in contact with the source region and drain region of the first conductivity type MOS device respectively, while two ends of the first conductivity type lower channel region in the SiC LDMOS device being in contact with the source region of the SiC LDMOS device and the first conductivity type well region of the first high-voltage region respectively; then, by adjusting an ion implantation window, performing ion implantation in certain areas of the second conductivity type buffer layer above the first conductivity type lower channel region to form a first conductivity type area isolated by the second conductivity type buffer layer, the first conductivity type area being in contact with the first conductivity type lower channel region; the second conductivity type conductive channel structure being prepared between the source region and drain region of the second conductivity type MOS device; specifically, first, performing ion implantation at a depth of 0.1-0.3 μm in the first conductivity type well region of the low-voltage region and in the first conductivity type well region of the second high-voltage region to form a second conductivity type lower channel region; then, by adjusting an ion implantation window, performing ion implantation in certain areas of the first conductivity type well region above the second conductivity type lower channel region to form a second conductivity type area isolated by the first conductivity type well region, the first conductivity type area being in contact with the second conductivity type lower channel region;

thereafter, forming a gate oxide layer by wet processing after annealing; then, depositing polysilicon over the first conductivity type conductive channel structure and the second conductivity type conductive channel structure on the gate oxide layer to form a polysilicon gate of a first conductivity type MOS, a polysilicon gate of an LDMOS, and a polysilicon gate of a second conductivity type MOS; and depositing a field effect oxide layer to cover the surface of the device completely, and etching the field effect oxide layer and depositing metal to form a drain metal electrode, gate metal electrode, and source metal electrode of the LDMOS, a drain metal electrode, gate metal electrode, and source metal electrode of the first conductivity type MOS, and a drain metal electrode, gate metal electrode, and source metal electrode of the second conductivity type MOS.

Compared with the prior art, the invention has the following advantages.

This patent provides a novel SiC channel structure. Compared to traditional SiC devices, the SiC channel structure allows the channel to open beneath a $SiC/SiO_2$ interface under the influence of gate voltage when the SiC device is in the "on" state. This allows the channel current to flow beneath the $SiC/SiO_2$ interface, reducing the impact of interface states on channel carrier mobility, thereby improving the channel carrier mobility of the SiC device, significantly lowering channel resistance and addressing the issue of excessive channel resistance caused by low channel mobility in SiC devices. The channel structure of the invention is divided into upper and lower sections. Taking N-type SiC devices as an example, when the device is turned off, the channel structure is jointly depleted by upper and lower P-type regions, without relying on interface states. In contrast, traditional buried channel structures require joint depletion from both interface states and the substrate when in the "off" state. However, the size of the interface states and the depletion condition of the buried channel are unpredictable, which can easily lead to the creation of normally-on devices. In addition, based on the novel channel structure, the invention introduces a fully integrated process of a SiC device, enabling the monolithic integration of SiC devices with other SiC circuits. Compared to traditional silicon-based circuits used alongside SiC power devices, this approach addresses the issue of silicon-based devices failing to operate normally in high-temperature and high-radiation environments and maximizes the performance of SiC devices.

BRIEF DESCRIPTION OF THE DRAWINGS

FIG. 2A illustrates one SiC channel structure and FIG. 2B illustrates another SiC channel structure.

FIGS. 4A to 4P are schematic diagrams of each step of the manufacturing process.

DETAILED DESCRIPTION OF THE EMBODIMENTS

The first conductivity type in the invention may be N-type or P-type. When the first conductivity type is N-type, the second conductivity type is P-type, and when the first conductivity type is P-type, the second conductivity type is N-type.

Embodiment 1

Figure 1:
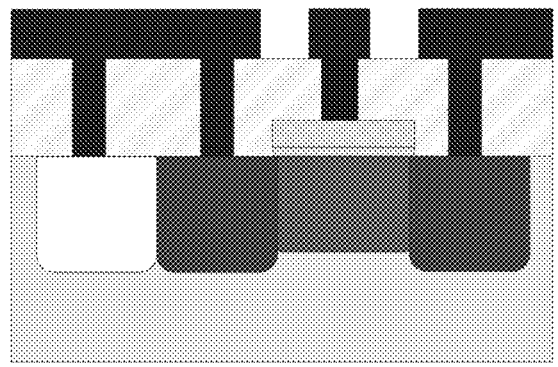
FIG. 1 is a schematic diagram of a conventional SiC buried channel structure.
Figure 2A:
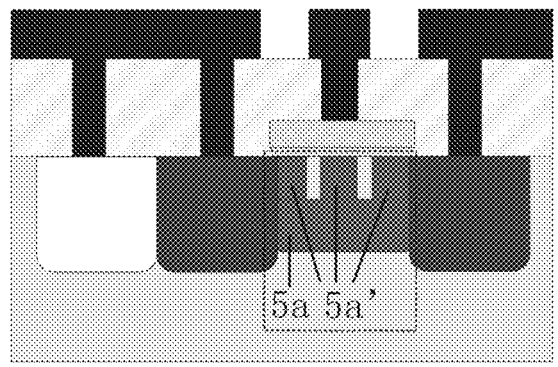
FIGS. 2A-2B show a SiC channel structure of the invention, where
Figure 2B:
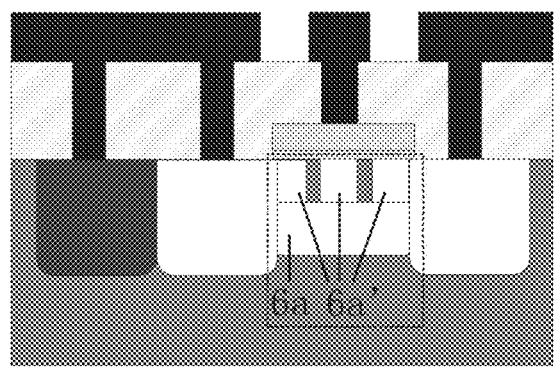

A conductive channel structure for SiC devices, referring to FIG. 2A, is a first conductivity type conductive channel structure 5 and comprises a first conductivity type lower channel region 5a arranged in the middle of a second conductivity type buffer layer 3 of the SiC device, wherein a first conductivity type area 5a' is arranged on the first conductivity type lower channel region 5a, and a top of the first conductivity type area 5a' is positioned on an upper surface of the second conductivity type buffer layer 3. In this embodiment, 1-3 first conductivity type areas 5a' with a width of 0.2-4 μm are provided, and a distance between adjacent first conductivity type areas 5a' is 0.2-4 μm.

Embodiment 2

A conductive channel structure for SiC devices is a second conductivity type conductive channel structure 6 and comprises a second conductivity type lower channel region 6a arranged in a middle of a second conductivity type buffer layer 3 of the SiC device, wherein a second conductivity type area 6a' is arranged on the second conductivity type lower channel region 6a, and a top of the second conductivity type area 6a' is positioned on an upper surface of the second conductivity type buffer layer 3. In this embodiment, 1-3 second conductivity type areas 6a' with a width of 0.2-4 μm are provided, and a distance between adjacent second conductivity type areas 6a' is 0.2-4 μm.

Embodiment 3

Figure 3:
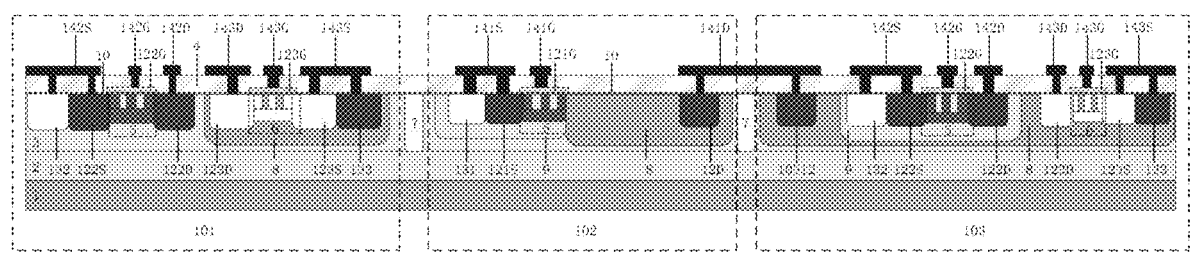
FIG. 3 is a schematic diagram of a fully integrated SiC device of the invention.

Referring to FIG. 3, a fully integrated SiC device comprises a first conductivity type SiC substrate layer 1, wherein a second conductivity type epitaxial layer 2 is arranged on the first conductivity type SiC substrate layer 1, a second conductivity type buffer layer 3 is arranged on the second conductivity type epitaxial layer 2, and a field effect oxide layer 4 covers the second conductivity type buffer layer 3; a second conductivity type isolation structure 7 is arranged in the second conductivity type buffer layer 3, and the second conductivity type buffer layer 3 is divided into a low-voltage region 101, a first high-voltage region 102 and a second high-voltage region 103 by the second conductivity type isolation structure 7;

a first conductivity type SiC LDMOS device is arranged in the first high-voltage region 102, and a first conductivity type SiC MOS device and/or a second conductivity type SiC MOS device are respectively arranged in the low-voltage region 101 and the second high-voltage region 103; at least one of the first conductivity type SiC LDMOS device and the first conductivity type SiC MOS device has a conductive channel structure which is the first conductivity type conductive channel structure 5, and/or the second conductivity type SiC MOS device has a conductive channel structure which is the second conductivity type conductive channel structure 6; In this embodiment, the conductive channel structures of the first conductivity type SiC LDMOS device and each of the first conductivity type SiC MOS devices all employ the first conductivity type conductive channel structure 5. Meanwhile, the conductive channel structures of each of the second conductivity type SiC MOS devices all employ the second conductivity type conductive channel structure The SiC LDMOS device comprises a first conductivity type well region 8 arranged in the second conductivity type buffer layer 3 located in the first high-voltage region 102 and a first conductivity type drain region 12d of the SiC LDMOS device arranged in the first conductivity type well region 8; a first conductivity type well region 8 is also arranged in the second conductivity type buffer layer 3 of the second high-voltage region 103, with a first conductivity type heavily doped region 10312 arranged therein; and a drain metal electrode 141D is connected to the first conductivity type drain region 12D and the first conductivity type heavily doped region 12 of the SiC LDMOS device. In this embodiment, the SiC LDMOS device further comprises a second conductivity type well region 9 arranged in the second conductivity type buffer layer 3; in the second conductivity type well region 9, a first conductivity type source region 121S of an LDMOS, a second conductivity type heavily doped region 131 and a conductive channel structure located between the first conductivity type source region 121S and the first conductivity type well region 8 are arranged; a first source metal electrode 141S is connected to the first conductivity type source region 121S and the second conductivity type heavily doped region 131, a polysilicon gate 121G of the LDMOS is arranged above the conductive channel structure, a gate metal electrode 141G of the LDMOS is connected to the polysilicon gate 121G, and a gate oxide layer 10 is arranged between the polysilicon gate 121G and the conductive channel of the LDMOS.

The first conductivity type SiC MOS device comprises a first conductivity type source region 122S of a first conductivity type MOS, a second conductivity type heavily doped region 132, a first conductivity type drain region 122D, and a conductive channel structure located between the first conductivity type source region 122S and the first conductivity type drain region 122D; a polysilicon gate 122G of the first conductivity type MOS is arranged above the conductive channel structure, a gate oxide layer 10 is arranged between the conductive channel structure and the polysilicon gate 122G, and a gate metal electrode 142G of the first conductivity type MOS is connected to the polysilicon gate 122G; a source metal electrode 142S of the first conductivity type MOS is connected to the first conductivity type source region 122S and the second conductivity type heavily doped region 132, and a drain metal electrode 142D of the first conductivity type MOS is connected to the first conductivity type drain region 122D.

The second conductivity type SiC MOS device comprises a second conductivity type source region 123S of a second conductivity type MOS, a first conductivity type heavily doped region 133, a second conductivity type drain region 123D, and a conductive channel structure located between the second conductivity type source region 123S and the second conductivity type drain region 123D; a polysilicon gate 123G of the second conductivity type MOS is arranged above the conductive channel structure, a gate oxide layer 10 is arranged between the conductive channel structure and the polysilicon gate 123G, and a gate metal electrode 143G of the second conductivity type MOS is connected to the polysilicon gate 123G; a source metal electrode 143S of the second conductivity type MOS is connected to the second conductivity type source region 123S and the first conductivity type heavily doped region 133, and a drain metal electrode 143D of the second conductivity type MOS is connected to the second conductivity type drain region 123D.

Embodiment 4

Figure 4A:
FIGS. 4A-4P show the manufacturing process of a fully integrated SiC device, where
Figure 4B:
Figure 4C:
Figure 4D:
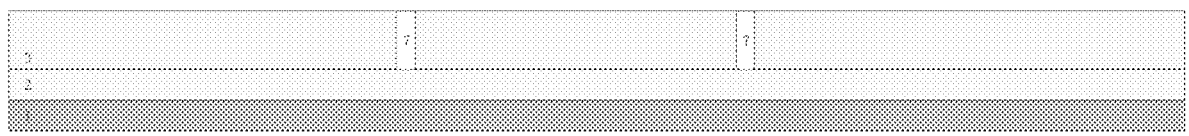
Figure 4E:
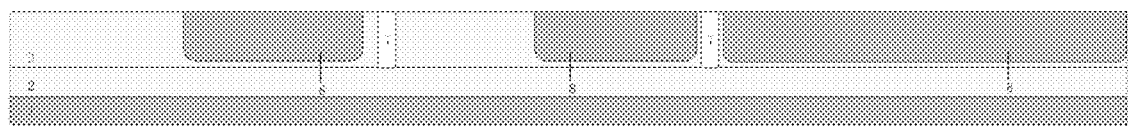
Figure 4F:
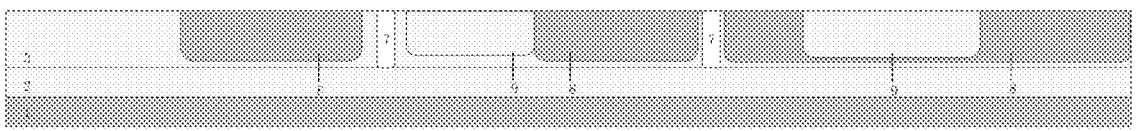
Figure 4G:
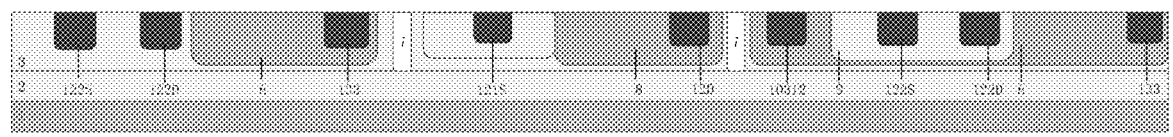
Figure 4H:
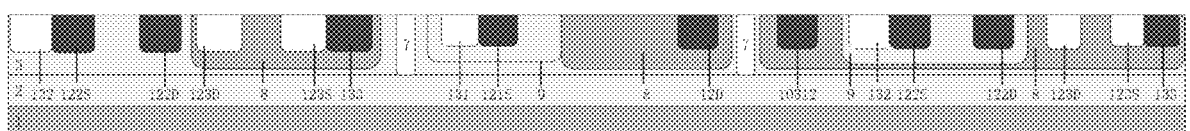
Figure 4I:
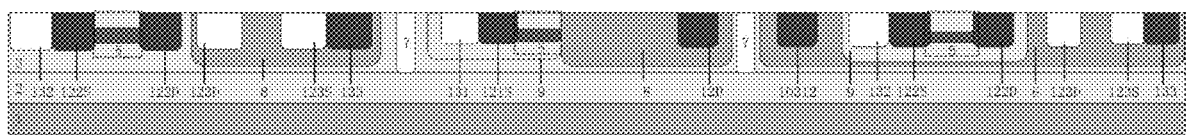
Figure 4J:
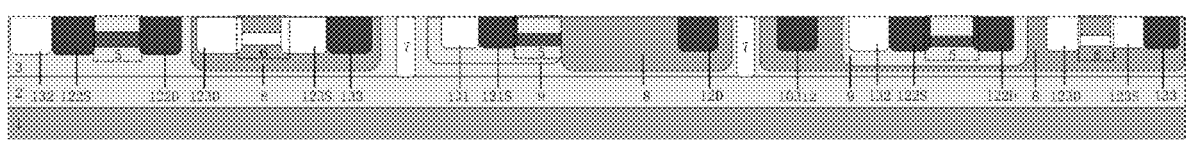
Figure 4K:
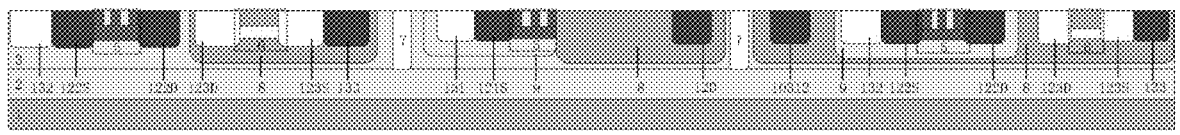
Figure 4L:
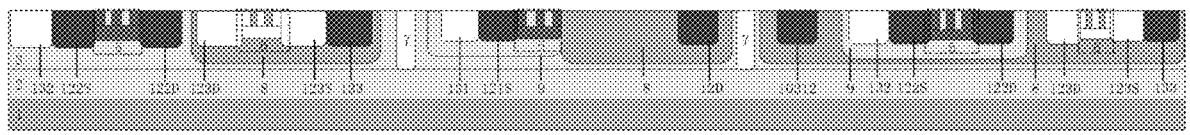
Figure 4M:
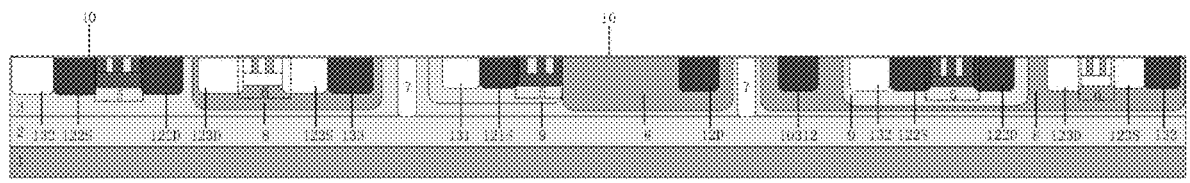
Figure 4N:
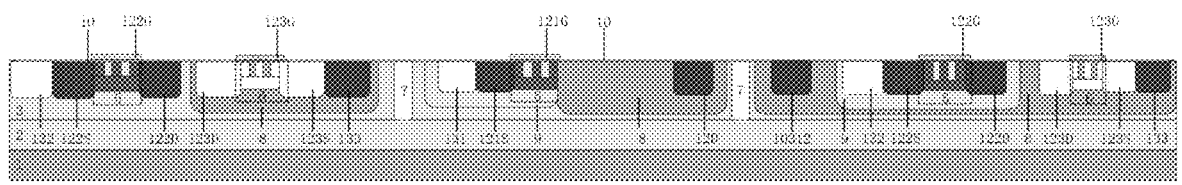
Figure 4O:
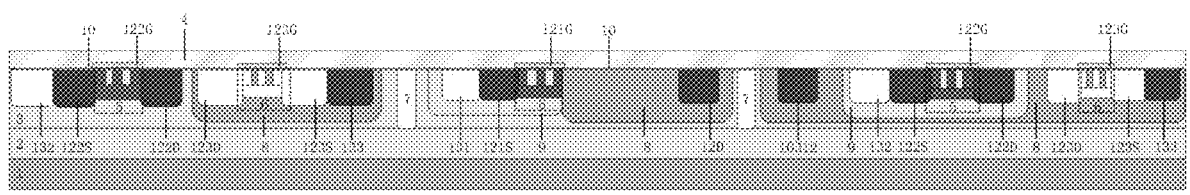
Figure 4P:
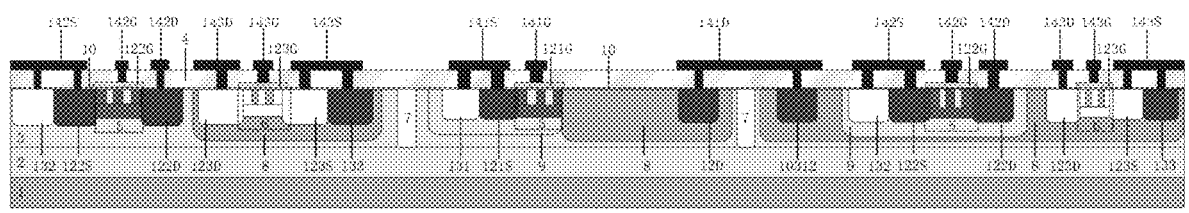

A fully integrated manufacturing process of a fully integrated SiC device, referring to FIGS. 4A-4P, comprises the following steps:

forming a first conductivity type substrate 1 on a SiC base, as an embodiment, the substrate having a thickness of 1 µm, and when the first conductivity type substrate 1 is an N-type substrate, a substrate doping type being nitrogen ions with a doping concentration of $1 \times 10^{19}$ cm$^{-3}$; growing a second conductivity type epitaxial layer 2 on the first conductivity type substrate 1, as an embodiment, the second conductivity type epitaxial layer 2 having a thickness of 1 µm, and when the second conductivity type epitaxial layer 2 is a P-type layer, a doping type being aluminum ions with a doping concentration of $1.1 \times 10^{17}$ cm$^{-3}$; growing a second conductivity type buffer layer 3 on the second conductivity type epitaxial layer 2, as an embodiment, the second conductivity type buffer layer 3 having a thickness of 1 µm, and when the second conductivity type buffer layer 3 is a P-type layer, a doping type being aluminum ions with a doping concentration of $1 \times 10^{16}$ cm$^{-3}$;

using ion implantation to form two second conductivity type isolation structures 7 in the second conductivity type buffer layer 3, which reach deep into the second conductivity type epitaxial layer 2, and divide the second conductivity type buffer layer 3 into a low-voltage region 101, a first high-voltage region 102 and a second high-voltage region 103; as an embodiment, the second conductivity type isolation structure 7 being a P-type isolation structure, with aluminum ions injected to achieve a concentration of $1 \times 10^{20}$ cm$^{-3}$ and an implantation depth of 1 µm;

performing ion implantation on the second conductivity type buffer layer 3 and forming the first conductivity type well regions 8 in the low-voltage region 101, the first high-voltage region 102 and the second high-voltage region 103 respectively; as an embodiment, the first conductivity type well region 8 being an N-type well region, with a doping type of nitrogen ions, a doping concentration of $2 \times 10^{16}$ cm$^{-3}$, and a well depth of 0.74 µm; performing ion implantation on the second conductivity type buffer layer 3 of the first high-voltage region 102 and the first conductivity type well region 8 of the second high-voltage region 103 to form a second conductivity type well region 9; as an embodiment, the second conductivity type well region 9 being an N-type well region, with a doping type of aluminum ions, a doping concentration of $2.5 \times 10^{16}$ cm$^{-3}$, and a well depth of 0.58 µm;

using ion implantation to form two first conductivity type heavily doped regions serving as a source region 122S and drain region 122D of a first conductivity type SiC MOS device, and one first conductivity type heavily doped region 133 of a second conductivity type MOS device in the second conductivity type buffer layer 3 and the first conductivity type well region 8 of the low-voltage region 101, one first conductivity type heavily doped region serving as a drain region 12D of a SiC LDMOS device, and one first conductivity type heavily doped region serving as a source region 121S of the SiC LDMOS device in the first conductivity type well region 8 and the second conductivity type well region 9 of the first high-voltage region 102, and two first conductivity type heavily doped regions serving as the source region 122S and drain region 122D of the first conductivity type SiC MOS device, a first conductivity type heavily doped region 133 of the second conductivity type MOS device, and a first conductivity type heavily doped region serving as a heavily doped ohmic contact region in the second conductivity type well region 9 and the first conductivity type well region 8 of the second high-voltage region 103; as an embodiment, the first conductivity type heavily doped region 12 being an N-type heavily doped region, with a doping type of nitrogen ions, a doping concentration of $1 \times 10^{20}$ cm$^{-3}$, and a depth of 0.31 µm;

using ion implantation to form one second conductivity type heavily doped region 132 of a first conductivity type MOS device and two second conductivity type heavily doped regions serving as a source region 123S and drain region 123D of a second conductivity type SiC MOS device in the second conductivity type buffer layer 3 and the first conductivity type well region 8 of the low-voltage region 101, one second conductivity type heavily doped region 131 of the SiC LDMOS device in the second conductivity type well region 9 of the first high-voltage region 102, and two second conductivity type heavily doped regions serving as the source region 123S and drain region 123D of the second conductivity type SiC MOS device, and a second conductivity type heavily doped region 132 of the first conductivity type MOS device in the first conductivity type well region 8 and the second conductivity type well region 9 of the second high-voltage region 103; as an embodiment, the second conductivity type heavily doped region being a P-type heavily doped region, with a doping type of aluminum ions, a doping concentration of $1 \times 10^{20}$ cm$^{-3}$, and a depth of 0.28 µm;

preparing conductive channel structures, comprising the preparation of a first conductivity type conductive channel structure 5 and a second conductivity type conductive channel structure 6; the first conductivity type conductive channel structure 5 being prepared between the source region 122S and the drain region 122D of the first conductivity type MOS device, as well as between the source region 121S of the SiC LDMOS device and the first conductivity type well region 8 of the first high-voltage region 102; specifically, first, performing ion implantation in the second conductivity type buffer layer 3 at a depth of 0.1-0.3 µm to form a first conductivity type lower channel region 5a, two ends of the first conductivity type lower channel region 5a in the first conductivity type MOS device being in contact with the source region 122S and drain region 122D of the first conductivity type MOS device respectively, while two ends of the first conductivity type lower channel region Sa in the SiC LDMOS device being in contact with the source region 121S of the SiC LDMOS device and the first conductivity type well region 8 of the first high-voltage region 102 respectively; then, by adjusting an ion implantation window, performing ion implantation in certain areas of the second conductivity type buffer layer 3 above the first conductivity type lower channel region 5a to form a first conductivity type area 5a' isolated by the second conductivity type buffer layer 3, the first conductivity type area 5a' being in contact with the first conductivity type lower channel region 5a; the second conductivity type conductive channel structure 6 being prepared between the source region 123S and drain region 123D of the second conductivity type MOS device; specifically, first, performing ion implantation at a depth of 0.1-0.3 µm in the first conductivity type well region 8 of the low-voltage region 101 and in the first conductivity type well region 8 of the second high-voltage region 103 to form a second conductivity type lower channel region 6a; then, by adjusting an ion implantation window, performing ion implantation in certain areas of the first conductivity type well region 8 above the second conductivity type lower channel region 6a to form a second conductivity type area 6a' isolated by the first conductivity type well region 8, the first conductivity type area 6a' being in contact with the second conductivity type lower channel region 6a; as an embodiment, 1-3 first conductivity type areas 5a' with a width of 0.2-4 µm being provided, and a distance between adjacent first conductivity type areas 5a' being 0.2-4 µm; and 1-3 second conductivity type areas 6a' with a width of 0.2-4 µm being provided, and a distance between adjacent second conductivity type areas 6a' being 0.2-4 µm;

thereafter, forming a gate oxide layer 10 by wet processing after annealing; as an embodiment, the annealing temperature being 1800° C., the annealing time being 5 minutes, and the gate oxide layer 10 being formed through wet processing in a steam atmosphere, undergoing a high-temperature treatment at 1200°° C. for 60 minutes, resulting in a gate oxide layer thickness of 45 nm; then, depositing polysilicon over the first conductivity type conductive channel structure 5 and the second conductivity type conductive channel structure 6 on the gate oxide layer 10, to form a polysilicon gate 122G of a first conductivity type MOS, a polysilicon gate 121G of an LDMOS, and a polysilicon gate 123G of a second conductivity type MOS; as an embodiment, a doping type of the polysilicon gate being phosphorus ions, with a doping concentration of $1 \times 10^{19}$ cm$^{-3}$; and depositing a field effect oxide layer 4 which may be 0.4 µm thick in this embodiment to cover the surface of the device completely, and etching the field effect oxide layer 4 and depositing metal to form a drain metal electrode 141D, gate metal electrode 141G, and source metal electrode 141S of the LDMOS, a drain metal electrode 142D, gate metal electrode 142G, and source metal electrode 142S of the first conductivity type MOS, and a drain metal electrode 143D, gate metal electrode 143G, and source metal electrode 143S of the second conductivity type MOS.

In this embodiment, 1-3 first conductivity type areas 5a' with a width of 0.2-4 µm are provided, and a distance between adjacent first conductivity type areas 5a' is 0.2-4 µm; and 1-3 second conductivity type areas 6a' with a width of 0.2-4 µm are provided, and a distance between adjacent second conductivity type areas 6a' is 0.2-4 µm.

What is claimed is:

1. A conductive channel structure for silicon carbide (SiC) devices, wherein the conductive channel structure is a first conductivity type conductive channel structure, comprising a first conductivity type lower channel region arranged in a middle of a second conductivity type buffer layer of the SiC device, wherein a first conductivity type area is arranged on the first conductivity type lower channel region, and a top of the first conductivity type area is positioned on an upper surface of the second conductivity type buffer layer;
   wherein:
   the first conductivity type area comprises a set of conductivity type portions vertically arranged over the second conductivity type buffer layer,
   the set of conductivity portions are isolated from direct contact with each other,
   each conductivity portion of the set of conductivity portions having a width of 0.2-4 micrometers, and
   two adjacent conductivity portions of the set of conductivity portions located at a horizontal distance ranging from 0.2-4 micrometers.

2. A conductive channel structure for SiC devices, wherein the conductive channel structure is a second conductivity type conductive channel structure, comprising a second conductivity type lower channel region arranged in a middle of a second conductivity type buffer layer of the SiC device, wherein a second conductivity type area is arranged on the second conductivity type lower channel region, and a top of the second conductivity type area is positioned on an upper surface of the second conductivity type buffer layer;
   wherein:
   the first conductivity type area comprises a set of conductivity type portions vertically arranged over the second conductivity type buffer layer,
   the set of conductivity portions are isolated from direct contact with each other,
   each conductivity portion of the set of conductivity portions having a width of 0.2-4 micrometers, and
   two adjacent conductivity portions of the set of conductivity portions located at a horizontal distance ranging from 0.2-4 micrometers.

3. A fully integrated manufacturing process of a fully integrated SiC device, comprising the following steps:
   forming a first conductivity type substrate on a SiC base, growing a second conductivity type epitaxial layer on the first conductivity type substrate, and growing a second conductivity type buffer layer on the second conductivity type epitaxial layer;
   using ion implantation to form two second conductivity type isolation structures in the second conductivity type buffer layer, and divide the second conductivity type buffer layer into a low-voltage region, a first high-voltage region and a second high-voltage region, wherein the two second conductivity type isolation structures reach deep into the second conductivity type epitaxial layer;

performing ion implantation on the second conductivity type buffer layer and forming first conductivity type well regions in the low-voltage region, the first high-voltage region and the second high-voltage region respectively; performing ion implantation on the second conductivity type buffer layer of the first high-voltage region and the first conductivity type well region of the second high-voltage region to form a second conductivity type well region;

using ion implantation to form two first conductivity type heavily doped regions serving as a source region and drain region of a first conductivity type SiC metal oxide semiconductor (MOS) device, and one first conductivity type heavily doped region of a second conductivity type MOS device in the second conductivity type buffer layer and the first conductivity type well region of the low-voltage region, one first conductivity type heavily doped region serving as a drain region of a SiC lateral double-diffused metal oxide semiconductor (LDMOS) device, and one first conductivity type heavily doped region serving as a source region of the SiC LDMOS device in the first conductivity type well region and the second conductivity type well region of the first high-voltage region, and two first conductivity type heavily doped regions serving as the source region and drain region of the first conductivity type SiC MOS device, a first conductivity type heavily doped region of the second conductivity type MOS device, and a first conductivity type heavily doped region serving as a heavily doped ohmic contact region in the second conductivity type well region and the first conductivity type well region of the second high-voltage region;

using ion implantation to form one second conductivity type heavily doped region of a first conductivity type MOS device and two second conductivity type heavily doped regions serving as a source region and drain region of a second conductivity type SiC MOS device in the second conductivity type buffer layer and the first conductivity type well region of the low-voltage region, one second conductivity type heavily doped region of the SiC LDMOS device in the second conductivity type well region of the first high-voltage region, and two second conductivity type heavily doped regions serving as the source region and drain region of the second conductivity type SiC MOS device, and a second conductivity type heavily doped region of the first conductivity type MOS device in the first conductivity type well region and the second conductivity type well region of the second high-voltage region;

preparing conductive channel structures, comprising preparation of a first conductivity type conductive channel structure and a second conductivity type conductive channel structure; the first conductivity type conductive channel structure being prepared between the source region and the drain region of the first conductivity type MOS device, as well as between the source region of the SiC LDMOS device and the first conductivity type well region of the first high-voltage region; wherein performing ion implantation in the second conductivity type buffer layer at a depth of 0.1-0.3 μm to form a first conductivity type lower channel region, two ends of the first conductivity type lower channel region in the first conductivity type MOS device being in contact with the source region and drain region of the first conductivity type MOS device respectively, while two ends of the first conductivity type lower channel region in the SiC LDMOS device being in contact with the source region of the SiC LDMOS device and the first conductivity type well region of the first high-voltage region respectively; and by adjusting an ion implantation window, performing ion implantation in predetermined areas of the second conductivity type buffer layer above the first conductivity type lower channel region to form a first conductivity type area isolated by the second conductivity type buffer layer, the first conductivity type area being in contact with the first conductivity type lower channel region; the second conductivity type conductive channel structure being prepared between the source region and drain region of the second conductivity type MOS device; wherein performing ion implantation at a depth of 0.1-0.3 μm in the first conductivity type well region of the low-voltage region and in the first conductivity type well region of the second high-voltage region to form a second conductivity type lower channel region; and by adjusting an ion implantation window, performing ion implantation in predetermined areas of the first conductivity type well region above the second conductivity type lower channel region to form a second conductivity type area isolated by the first conductivity type well region, the first conductivity type area being in contact with the second conductivity type lower channel region;

forming a gate oxide layer by wet processing after annealing; depositing polysilicon over the first conductivity type conductive channel structure and the second conductivity type conductive channel structure on the gate oxide layer, to form a polysilicon gate of a first conductivity type MOS, a polysilicon gate of an LDMOS, and a polysilicon gate of a second conductivity type MOS; and depositing a field effect oxide layer to cover a surface of the device completely, and etching the field effect oxide layer and depositing metal to form a drain metal electrode, gate metal electrode, and source metal electrode of the LDMOS, a drain metal electrode, gate metal electrode, and source metal electrode of the first conductivity type MOS, and a drain metal electrode, gate metal electrode, and source metal electrode of the second conductivity type MOS wherein:

the first conductivity type area comprises a set of conductivity type portions vertically arranged over the second conductivity type buffer layer, the set of conductivity portions are isolated from direct contact with each other, each conductivity portion of the set of conductivity portions having a width of 0.2-4 micrometers, and two adjacent conductivity portions of the set of conductivity portions located at a horizontal distance ranging from 0.2-4 micrometers.

4. The fully integrated manufacturing process of a fully integrated SiC device according to claim 3, wherein:

the second conductivity type area comprises a set of conductivity type sections vertically arranged over the second conductivity type buffer layer, the set of conductivity sections are isolated from direct contact with each other, each conductivity section of the set of conductivity sections having a width of 0.2-4 micrometers, and two adjacent conductivity sections of the set of conductivity sections located at a horizontal distance ranging from 0.2-4 micrometers.

\* \* \* \* \*